United States Patent [19]
Weisman et al.

[11] Patent Number: 5,224,016
[45] Date of Patent: Jun. 29, 1993

[54] RETAINER FOR ELECTRONIC MODULES

[75] Inventors: Arnold M. Weisman, San Gabriel; Mitchell Merritt, Glendora; Larry Costigan, IV, West Covina, all of Calif.

[73] Assignee: Calmark Corporation, San Gabriel, Calif.

[21] Appl. No.: 530,991

[22] Filed: May 31, 1990

[51] Int. Cl.$^5$ .............................................. H05K 7/20
[52] U.S. Cl. ................................... 361/388; 361/386; 361/391; 361/415; 174/16.3; 165/80.1
[58] Field of Search ............. 361/386, 387, 388, 389, 361/391, 395, 415; 165/80.1, 80.2, 80.3; 174/16.3

[56] References Cited

U.S. PATENT DOCUMENTS

| | | |
|---|---|---|
| 3,451,034 | 6/1969 | Beale . |
| 3,767,058 | 10/1973 | Barlow . |
| 4,232,926 | 11/1980 | Inouye . |
| 4,233,646 | 11/1980 | Leung . |
| 4,298,904 | 11/1981 | Koenig . |
| 4,414,605 | 11/1983 | Chino . |
| 4,480,287 | 10/1984 | Jensen . |
| 4,632,588 | 12/1986 | Fitzpatrick . |
| 4,648,009 | 3/1987 | Beun . |
| 4,819,713 | 4/1989 | Weisman .................. 165/1 |
| 4,914,552 | 4/1990 | Kecmer ..................... 361/415 |
| 5,003,431 | 3/1991 | Imsdahl .................... 361/415 |

FOREIGN PATENT DOCUMENTS 2101812A 6/1982 United Kingdom .

OTHER PUBLICATIONS

Calmark Corporation brochure, "Series L225 — 'card-lok' retainer (lever-lok)."

*Primary Examiner*—Leo P. Picard
*Assistant Examiner*—Young S. Whang
*Attorney, Agent, or Firm*—Spensley Horn Horn & Lubitz

[57] ABSTRACT

A retainer for retaining an electronic module, such as a printed circuit board, in the slot of a casing. Oppositely oriented wedge-shaped elements are slidingly received on a rail in a manner which prevents rotation of the wedge-shaped elements about the rail. A pivotable lever having a cam surface is provided such that rotation of the lever actuates the retainer by compressing the wedge-shaped elements. In one embodiment, the lever is provided with a projection which engages the casing to extract the module when the lever is pivoted to release the retainer.

11 Claims, 4 Drawing Sheets

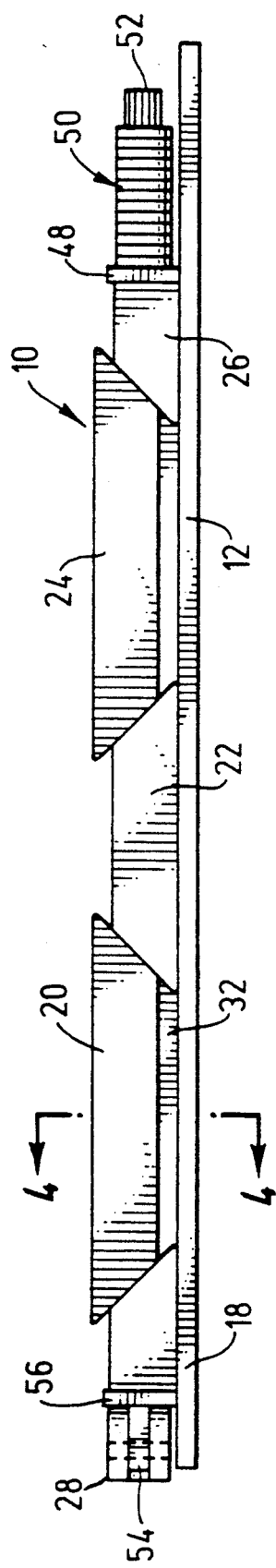
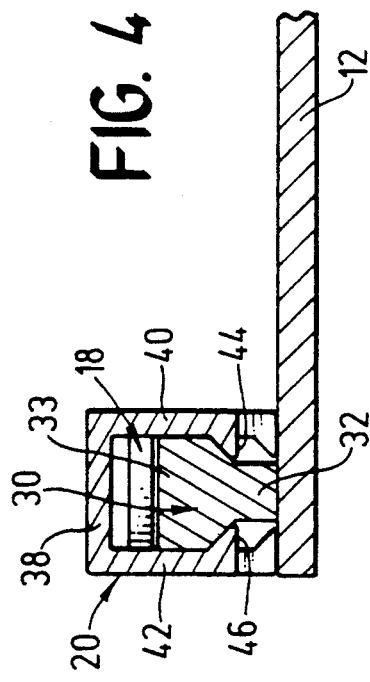

RETAINER FOR ELECTRONIC MODULES

BACKGROUND OF THE INVENTION

1. Field of the Invention

The present invention relates to retainers for electronic modules, in particular, to retainers which allow rapid, easy, and tool-free installation and removal of electronic modules.

2. Description of Related Art

Electronic modules, such as printed circuit boards, are frequently mounted in casings having two opposing parallel walls. The walls are provided with corresponding slots which receive opposite edges of the electronic module so that the module is supported, like a tray, between the opposing walls. Typically in such a configuration, the width of the slots is greater than the thickness of the electronic module. This size disparity allows for easy insertion of the modules and allows the slot to accommodate modules of varying thicknesses.

However, as a result of the loose fit of the module within the slot, if the module is not held firmly within the slot, the module is more susceptible to damage resulting from vibration or shock. Further, such casings are frequently designed as heat exchangers, commonly called cold plates, to dissipate heat generated by the electronic module. For the casing to work efficiently as a heat exchanger, it is desirable to maintain the electronic module in firm contact with the casing to provide a reliable thermal path and improve the heat transfer between the electronic module and the casing.

To reduce damage to the electronic module resulting from shock, vibration, and poor heat transfer, retainers have been developed to clamp electronic modules firmly against an edge of the casing slots. U.S. Pat. Nos. 3,767,058 to Barlow et al. and 4,298,904 to Koenig each describe retainers having wedge-shaped elements received on a threaded rod. These retainers can be inserted into the slot with the electronic module. The threaded rod is then turned to bias the wedge-shaped elements which slide along the faces of the wedges-shaped elements to exert a clamping force lateral to the axis of the rod to maintain the electronic module firmly within the slot.

However, with this type of retainer, it is necessary to turn the threaded rod to tighten or loosen the electronic module each time it is desired to insert or remove the module. This is tedious and time consuming, and typically requires a separate tool. As a result, installation or removal of the module is inconvenient and may be thwarted if the appropriate tool is not readily available.

One type of available retainer uses wedge-shaped elements and allows for tool-free insertion and removal by providing a lever operated cam surface for biasing the wedge-shaped elements. However, with this device, as well as the other devices described above, it is possible for the wedge-shaped elements to rotate about the rod and become misaligned. Should this occur the retainer will be inoperable unless the elements can be properly oriented, a task which is not always simple given the limited access frequently imposed by the environment in which the retainers are used.

A retainer having wedge-shaped elements in which the elements are prevented from rotating is described in U.S. Pat. No. 4,480,287 to Jensen. However, this retainer requires the rotation of a threaded element to bias the wedge-shaped elements. As a consequence, this retainer, and other similar retainers, suffer from the previously described drawbacks associated with such a system.

U.S. Pat. No. 4,414,605 to Chino et al. describes a retainer having a wedge-shaped element received on a threaded rod. A pivotal driver blade is provided for turning the rod which is received by a threaded aperture in the case. The pivotal driver blade has a cam surface which, when the driver blade is pivoted, biases the wedge-shaped element. However, this device requires a special casing having a threaded aperture for receiving the threaded rod. In addition, this device still includes the tedious and time consuming step of rotating the rod every time the electronic module is installed or removed.

None of the devices described above provides positive extraction force to facilitate removal of an electronic module. Such a positive extraction force is desirable because typically one end of the electronic module is plugged into a connector which often has a high retention force. In addition, it is possible for the electronic module to adhere or stick to the slot, particularly when the module has been tightly clamped against the slot for an extended period of time. Alternatively, the electronic module may become wedged or jammed in the slot. As a result, merely loosening the retainer may not be enough to facilitate easy removal of the electronic module.

The clamp arrangement described in GB 2,101,812A shows a system of levers attached directly to a printed circuit board. A first lever includes a projection which contacts the casing to extract the printed circuit board when the first lever is rotated. Rotation of the first lever also controls a second lever, also mounted directly to the printed circuit board, which actuates a clamp mechanism made of alternating large and small cylinders in a staggered arrangement. This clamp arrangement includes a large number of intricate parts which make the clamp expensive, difficult to manufacture and assemble, and more prone to failure.

SUMMARY OF THE INVENTION

Accordingly, it is an object of the present invention to provide a retainer for an electronic module that allows for rapid, easy, tool-free insertion and extraction of the electronic module.

A further object of the invention is to provide a retainer for an electronic module which is reliable, uncomplicated, and inexpensive to manufacture and assemble.

In accordance with these and other objects, a retainer in accordance with the present invention comprises a wedge component slidingly received on a shaft such that it is substantially prevented from rotating about the shaft. A first stop is attached to the shaft on one side of the wedge component, and a second stop is pivotally attached to the shaft on the other side of the wedge component. The second stop is pivotable between a first position and a second position and includes a cam surface shaped to bias the wedge component when in the second position.

In another aspect of the invention, the second stop includes a portion shaped to engage the casing to exert an extraction force on the retainer as the second stop is pivoted from the second position to the first position.

Other objects and aspects of the invention will become apparent to those skilled in the art from the following detailed description of the invention which is presented by way of example and not as a limitation of the present invention.

BRIEF DESCRIPTION OF THE DRAWINGS

FIG. 3 is a side view of the embodiment of FIG. 2 in the installed, or compressed, position.

FIG. 4 is a cross sectional view taken along line 4—4 in FIG. 3.

DESCRIPTION OF THE ILLUSTRATED EMBODIMENT

Figure 1:
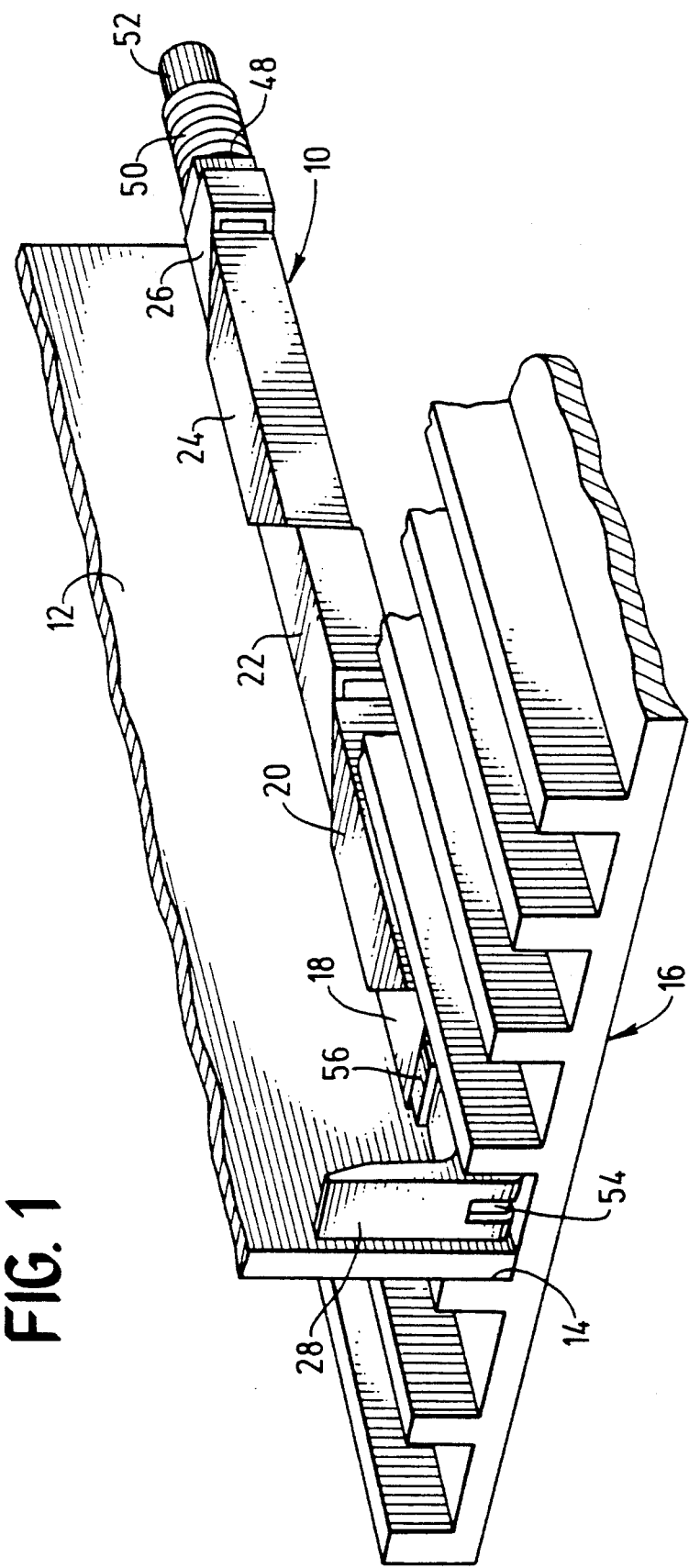
FIG. 1 is an elevated perspective view of a retainer in accordance with a preferred embodiment of the present invention. The retainer is shown attached to a printed circuit board and positioned in the slot of a casing. The printed circuit board and the casing are partially cut away.

A retainer for an electronic module in accordance with a preferred embodiment of the present invention is indicated in FIG. 1 as reference numeral 10. The retainer 10 is shown attached to a printed circuit board 12 and positioned in a slot 14 of a casing 16. The illustrated retainer 10 has five wedge members 18, 20, 22, 24, and 26 arranged in an end to end fashion with successive wedge members being oppositely oriented. When the wedge members are compressed by the action of lever 28, the wedge members slide along their oppositely oriented faces and the retainer 10 expands laterally to clamp the printed circuit board 12 firmly within the slot 14.

Figure 2:
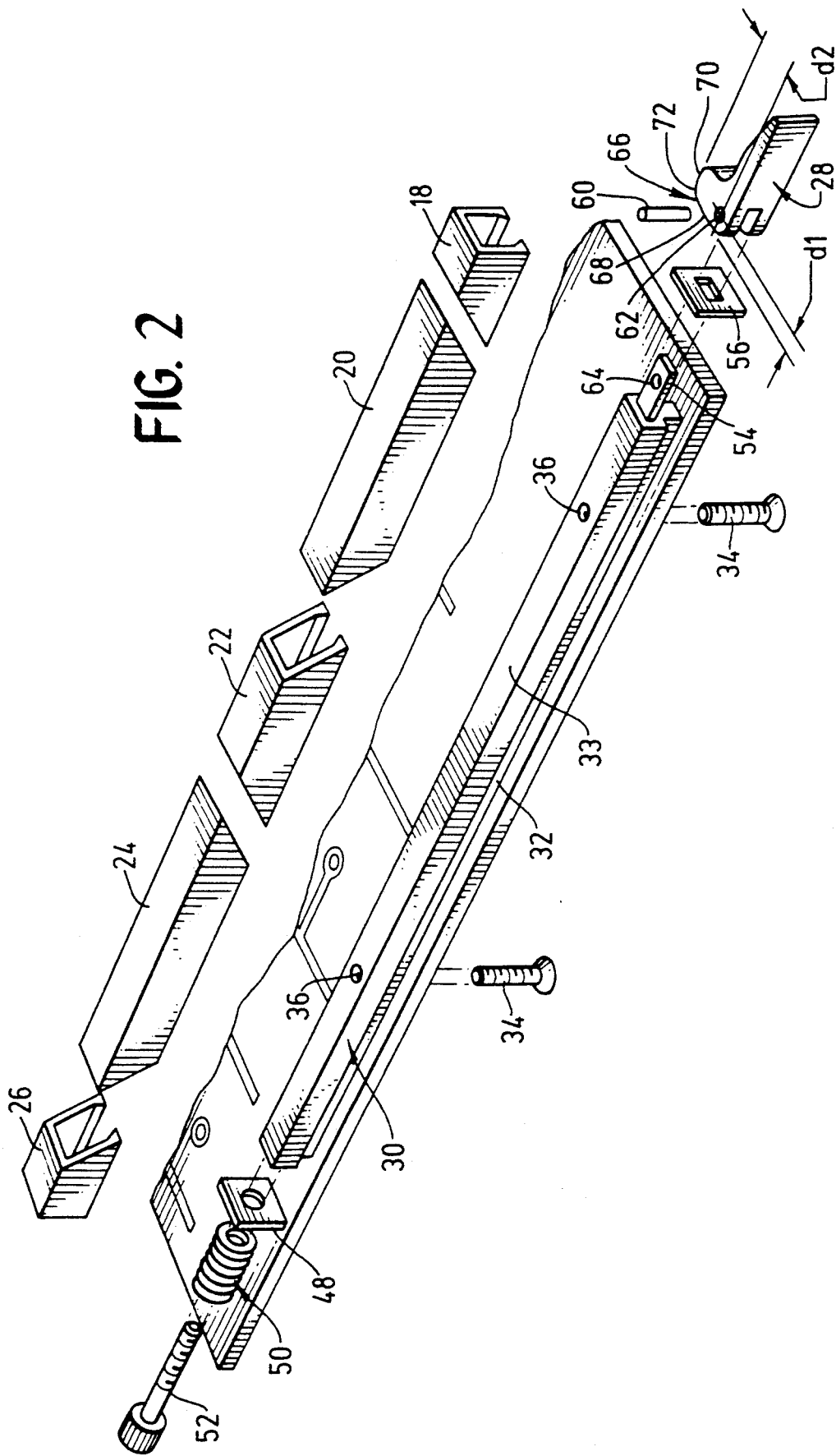
FIG. 2 is an exploded view of the embodiment of FIG. 1 including the printed circuit board but without the casing.

As best seen in FIG. 2, the retainer in the illustrated embodiment includes a central rail 30 for receiving the wedge members. As will be explained in greater detail below, the wedge members define interior surfaces which engage the outer surface of the rail 30. These surfaces are configured in a manner which allows the wedge members to slide axially and laterally with respect to the rail 30, yet limit undesirable rotation of the wedge members. Furthermore, a lever is provided which allows the wedge members to be quickly compressed together to clamp the printed circuit board 12 firmly in place.

In the illustrated embodiment, the rail 30 has a substantially "T" shaped cross section (seen best in FIG. 4) having a narrow base portion 32 and an expanded top portion 33. As shown in FIGS. 3 and 4, the rail 30 is attached to the printed circuit board 12 with the bottom of the narrow base portion 32 abutting the printed circuit board 12. Screws 34 (FIG. 2) pass through the printed circuit board 12 and are received by threaded apertures 36 to attach the rail 30 firmly to the printed circuit board 12. However, a variety of attachment means, such as rivets or adhesives, could be used in other embodiments.

In cold plate applications, the configuration of the illustrated embodiment is particularly advantageous because the intimate contact between the rail 30 and the printed circuit 12 board facilitates efficient heat transfer from the printed circuit board 12 to the retainer 10. In such an application, it is desirable that the rail 30, as well as the other components of the retainer, be made of a material, such as aluminum, which is a good conductor of heat. However, it should be appreciated that the retainer of the present invention is capable of use in a wide variety of applications, including those in which heat transfer is not a consideration. Accordingly, suitable materials for making the retainer may vary with the intended use of the retainer.

The wedge members 18, 20, 22, 24, and 26 are slidingly received on the rail 30 and all have a similar cross sectional shape. The shape of the cross section prevents the components from being removed from the rail except by sliding them off an end of the rail, allows limited up and down movement of the components with respect to the rail, and limits rotation of the components about the rail. The cross section of wedge member 20, illustrated in FIG. 4, is exemplary. The cross sectional shape of each wedge member is generally rectangular. Each wedge member has a top wall 38, and two side walls 40 and 42. The side walls 40 and 42 are spaced to receive the expanded top portion 33 of the rail 30. Flanges 44 and 46 extend inwardly from the base of side walls 40 and 42, respectively. The flanges 44 and 46 define an opening along the bottom of each wedge member which is wider than the narrow base portion 32 of the rail 30, but narrower than the expanded top portion 33 of the rail 30. As a result of this configuration, each wedge member can slide freely along the rail, but is prevented from substantial rotation about the axis of the rail.

Further, because the distance between the top wall 38 and the flanges 44 and 46 is greater than the height of the expanded top portion 33 of the rail 30, each wedge member can move up and down on the rail 30. Upward travel of the wedge member is limited by engagement of flanges 44 and 46 with the lower surface of the expanded top portion 33 of the rail 30. Downward travel is limited either by the top wall 38 abutting the top of the expanded top portion or the bases of the side walls 40 and 42 abutting the printed circuit board depending on the dimensions of the particular retainer.

When viewed from the side, as in FIGS. 2 and 3, each of the wedge members 18, 20, 22, 24, and 26 is shaped like a trapezoid. As a result of this trapezoidal shape, the wedge members have ramped ends. In the assembled retainer, seen best in FIG. 3, successive wedge members are slidingly received on the rail in opposite orientations. As a result, when the retainer 10 is actuated by applying a compressive force along the axis of the rail 30, the ends of adjacent wedge members slide with respect to one another. This creates a staggered configuration in which alternating wedge members travel upward and the remaining wedge members travel downward. The resulting lateral expansion of the retainer 10 with respect to the axis of the rail provides a clamping force to hold the printed circuit board 10 firmly within the slot.

As best seen in FIG. 2, the wedge members are prevented from sliding off one end of the rail 30 by the presence of a washer 48. The washer 48 is biased toward the end of the rail by a plurality of spring washers 50. A bolt 52 extends through both the spring washers 50 and the washer 48 and is received in a threaded aperture in the end of the rail 30.

An extension element 54 is provided at the other end of the rail 30. A washer 56 is slidingly received on the extension element 54 to prevent the wedge members from sliding off the rail 30. The washer 56 is maintained on extension element 54 by a lever 28 which is pivotally mounted on the extension element 54 by pivot pin 60 which passes through aperture 62 in the lever 28 and aperture 64 in the extension element 54.

Lever 28 is provided with a cam surface 66 which allows actuation of the retainer by pivoting the lever from a first position, shown in FIG. 2, to a second position, shown in FIG. 1. The cam surface 66 has two generally flat regions 68 and 70 joined by a curved region 72. The perpendicular distance d1 between the first flat region 68 and the pivot pin 60 is less than the perpendicular distance d2 between the second flat region 70 and the pivot pin 60. As a result, pivoting the lever from the first position to the second position shortens the distance between the first stop and the second stop, thereby compressing the wedge members to actuate the retainer.

A wide variety of cam surfaces might be used to accomplish the same results as the surface described above. All such surfaces are within the contemplation of the present invention. For example, in the illustrated embodiment, there are two generally flat regions 68 and 70. These regions need not be flat. However, the use of the flat regions is advantageous because the flat regions abut against the flat surface of the washer 56 to provide a self-locking action. That is, the use of the two flat regions tends to define two distinct positions and to maintain the lever in either the first or the second position thereby preventing the lever from accidentally or inadvertently pivoting between the two positions. In the illustrated embodiment the curved region 72 provides a smooth transition between regions 68 and 70 and facilitates pivoting of the lever 28.

The amount of compression, and hence the amount of expansion and the compressive force, provided by pivoting the lever is dictated by the geometry of the lever. Accordingly, in order to allow the illustrated retainer to be used in a wide variety of situations with electronic modules o varying thicknesses and in slots of varying size, the initial compression of the wedge members can be adjusted by threading bolt 52 into or out of the rail.

Typically, initial adjustment of the retainer can be accomplished by placing the retainer and electronic module into the slot. Then, with the lever 28 in the second position, threading bolt 52 into the rail 30 until the desired clamping force is achieved. It should be noted that the clamping force depends on the compression of the spring washers 50. Further, the outside end of wedge member 26 will likely extend beyond the end of the rail 30. Following the initial adjustment the module and retainer may be removed from the slot simply by pivoting the lever to the first position.

Once the retainer has been properly adjusted, actuation of the retainer, and hence installation of the electronic module, can be accomplished simply by pivoting the lever 28 from the first position to the second position. Similarly, pivoting the lever 28 from the second position to the first position will release the clamping force of the retainer for easy, tool-free extraction of the module.

For convenience, it is desirable that the retainer be mounted such that the lever 28 is readily accessible. In the illustrated embodiment the retainer is attached to the printed circuit board with the lever near the edge of the circuit board for easy access. However, in another embodiment it may be desirable to attach the retainer to the casing rather than the electronic module. In such case, it would be desirable for the retainer to be mounted such that the lever is readily accessible.

Figure 5:
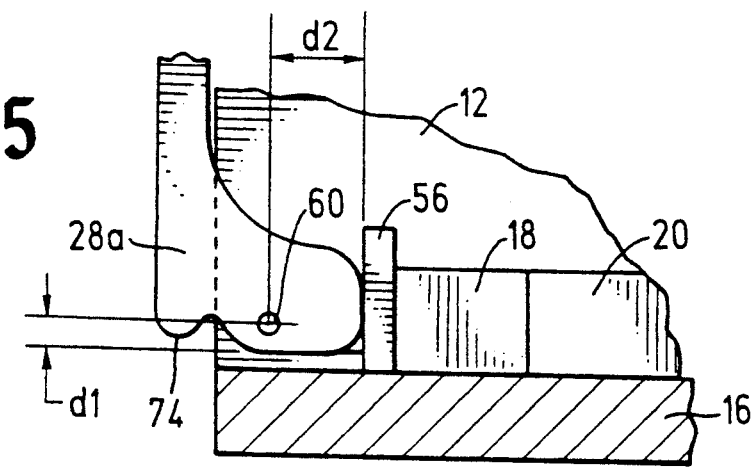
FIG. 5 is a top view of an alternative embodiment of the present invention showing the lever in the second, or compressed, position with a cross section of the casing and the printed circuit board partially cutaway.
Figure 6:
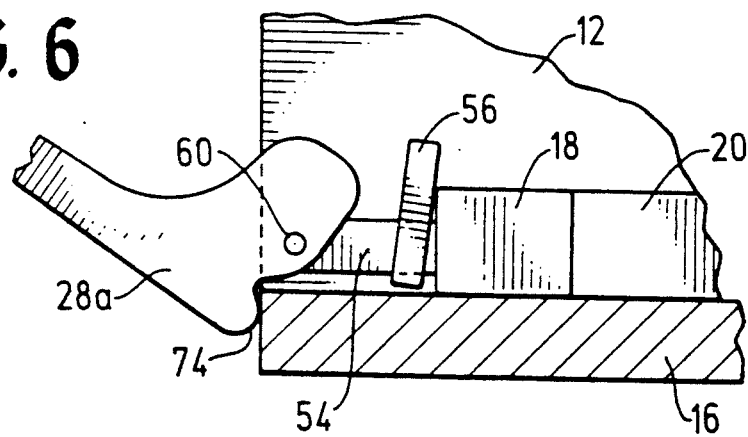
FIG. 6 is a partial top view of the embodiment of FIG. 5 showing the lever between the second and the first positions.
Figure 7:
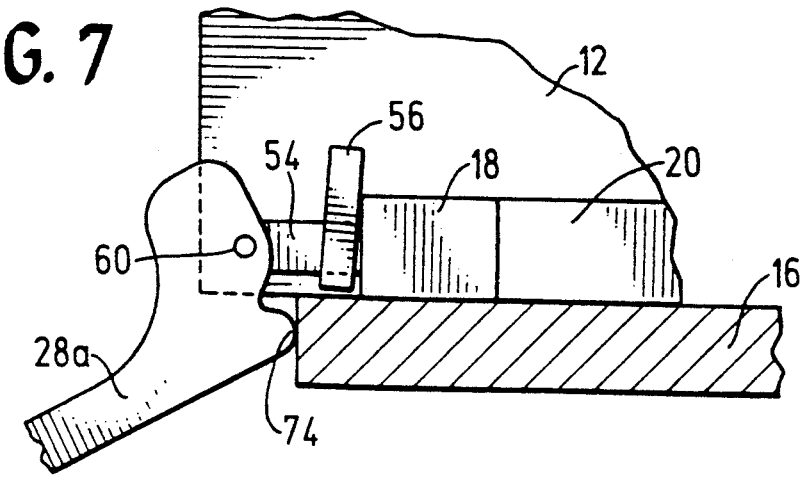
FIG. 7 is similar to FIG. 6 with the lever in the first, or released, position and the module in an extracted position.

In an alternative embodiment of the lever 28a, illustrated in FIG. 5, the lever 28a further includes a projection 74. The projection 74 is shaped and positioned such that as the lever 28a is pivoted from the second position, the projection engages the housing, as seen in FIG. 6. As the lever is pivoted from the position shown in FIG. 6 to the second position, illustrated in FIG. 7, the projection serves as a fulcrum to pry the printed circuit board from the slot.

In this manner, a positive extraction force is generated which facilitates removal of the printed circuit board by providing a mechanical device for applying a force to overcome the retentive force of a connector or the like which the circuit board may be plugged into. The positive extraction force is also desirable should the circuit board become stuck or jammed within the slot.

The incorporation of projection 74 and the cam surface 66 into a single lever 28a also serves to ensure that the wedge members are fully released prior to extraction of the circuit board. Further, the lever 28a is attached directly to the rail 30 which is attached directly to the printed circuit board. Thus, the extraction force generated by rotating lever 28a is transferred directly to the printed circuit board rather than through the moveable wedge members. These two features facilitate efficient removal of the circuit board by reducing the possibility of the wedge members re-locking, i.e., expanding, during the extraction process.

In both of the illustrated embodiments, five wedge members are shown. However, in various situations it may be desirable to use more or fewer wedge members. Similarly, the length of the wedge members may also be varied according to the intended use of the retainer. By varying the length and number of wedge members, it is possible to produce retainers of different lengths.

Typically it is desirable for the length of the retainer to be similar to the length of the electronic module so that the clamping force is distributed along the entire length of the module. Further, in many circumstances a retainer having more shorter wedge members may result in a more uniform distribution of forces than a retainer with fewer longer wedge members.

This detailed description is set forth only for purposes of illustrating an example of the present invention and should not be considered to limit the scope thereof in any way. For example, the present description relates to a retainer for a printed circuit board. However, the invention may be used with a wide variety of electronic modules. Clearly numerous additions, substitutions, and other modifications can be made to the invention without departing from the scope of the invention which is defined in the appended claims and equivalents thereof.

What is claimed is:

1. A retainer for retaining an electronic module in a case, comprising:
   a rail;
   a first stop coupled to the rail;
   a second stop coupled to the rail, the second stop being pivotable between a first position and a second position and having a cam surface shaped to define first and second camming surface portions such that the distance between the first stop and the first camming surface portion of the second stop when the second stop is in the first position is greater than the distance between the first stop and the second camming surface portion of the second stop when the second stop is in the second position;

a wedge member slidingly carried by the rail between the first stop and the second stop and mechanically coupled to the second camming surface of the second stop so as to be actuated by the second stop, the rail and wedge member being configured such that the wedge member is substantially prevented from rotating about the rail.

2. The retainer of claim 1 wherein the rail has a generally T-shaped cross section.

3. The retainer of claim 2 wherein the wedge member has a hollow rectangular cross section.

4. The retainer of claim 1 wherein the second stop comprises a lever to pivot the second stop between the first and second positions.

5. The retainer of claim 4 wherein the second stop is shaped to engage the casing as the second stop is pivoted from the second position to the first position to facilitate extraction of the retainer.

6. The retainer of claim 5 wherein the retainer is attached to the module.

7. A retainer for retaining an electronic module in a case, comprising:
a rail;
a wedge member slidingly received by the rail;
a first stop attached to the rail on a first side of said wedge member; and
a second stop attached to the rail on a second side of said wedge member, the second stop being pivotable between a first position and an intermediate position and between the intermediate position and a second position and having a cam surface mechanically coupled to the wedge member and shaped to bias the wedge member as the second stop is pivoted from the intermediate position to the second position to cause the wedge member to exert a retaining force against the case, the second stop having a portion shaped to engage the case to exert an extraction force on the retainer as the second stop is provided from the intermediate position to the first position.

8. The retainer of claim 7 wherein the rail has a T-shaped cross section and the wedge member has a hollow interior which defines a rectangular cross section with a slot on one side, the top of said T-shaped cross section being received within the hollow interior of the wedge member and the base of the T-shaped cross section extending through the slot.

9. The retainer of claim 8 wherein the second stop comprises a lever to pivot the second stop between the first position and second position.

10. A retainer for retaining an electronic module in a case, comprising:
a rail having a surface;
a plurality of wedge members slidingly carried by the rail surface in an aligned manner, said wedge members each having a support surface slidingly engaging the rail surface, and an angled surface adapted to slidingly engage a corresponding angled surface of an adjacent wedge member when actuated; and
a lever pivotally coupled to the rail and having a camming surface mechanically coupled to the wedge members so that pivoting of the lever causes the wedge members to be actuated;
wherein the rail surface and the wedge member support surfaces are shaped to retain the wedge members substantially aligned.

11. A retainer for retaining an electronic module in a case, comprising:
a rail having a top portion of rectangular cross section and a stem portion so that the rail has a T-shaped cross section;
means for fastening the rail to an electronic module;
a first stop carried adjacent one end of the rail;
means for adjusting the position of the first stop on the rail;
a plurality of hollow tubular wedge members slidingly carried on the top portion of the rail in an aligned manner, said wedge members each having a generally rectangular cross-section to define an interior of rectangular cross section, and an angled surface adapted to slidingly engage a corresponding angled surface of an adjacent wedge member when compressed together to thereby engage the case in a direction lateral to the rail, each wedge member further defining an aperture along one side of the wedge member adapted to receive the stem portion of the rail with the rectangular top portion of the rail being received within the rectangular interior of the member to retain the wedge members substantially aligned; and
a lever pivotally coupled to the other end of the rail and having a camming surface mechanically coupled to the wedge members so that pivoting of the lever in a first direction causes the wedge members to be compressed together between the lever camming surface and the first stop, said lever further having a projection positioned to engage the case when the lever is pivoted in a second direction and to cause the retainer and the module to be extracted from the case.

* * * * *